(12) United States Patent
Choi et al.

(10) Patent No.: US 7,859,099 B2
(45) Date of Patent: Dec. 28, 2010

(54) INTEGRATED CIRCUIT PACKAGING SYSTEM HAVING THROUGH SILICON VIA WITH DIRECT INTERCONNECTS AND METHOD OF MANUFACTURE THEREOF

(75) Inventors: A Leam Choi, Ichon-si (KR); Jae Han Chung, Ichon-si (KR); DeokKyung Yang, Hanam-si (KR); HyungSang Park, Hanam-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/333,297

(22) Filed: Dec. 11, 2008

(65) Prior Publication Data

US 2010/0148354 A1 Jun. 17, 2010

(51) Int. Cl.
*H01L 23/04* (2006.01)
(52) U.S. Cl. .................. 257/698; 438/107; 438/108; 438/109; 438/125
(58) Field of Classification Search .......... 257/698; 438/107–109, 125
See application file for complete search history.

(56) References Cited

U.S. PATENT DOCUMENTS

| | | | |
|---|---|---|---|
| 6,617,681 B1 * | 9/2003 | Bohr | 257/700 |
| 7,279,795 B2 * | 10/2007 | Periaman et al. | 257/777 |
| 7,723,159 B2 | 5/2010 | Do et al. | |
| 2007/0090508 A1 * | 4/2007 | Lin et al. | 257/686 |
| 2007/0158809 A1 * | 7/2007 | Chow et al. | 257/686 |
| 2008/0272504 A1 | 11/2008 | Do et al. | |

OTHER PUBLICATIONS

Definition of "overhang"; "McGraw-Hill Dictionary of Scientific and Technical Terms, Sixth Edition", 2003, pp. 1505-1506, Publisher: McGraw-Hill, New York.

* cited by examiner

*Primary Examiner*—Zandra Smith
*Assistant Examiner*—Paul E Patton
(74) *Attorney, Agent, or Firm*—Mikio Ishimaru

(57) ABSTRACT

A method of manufacture of an integrated circuit packaging system includes: providing a through silicon via die having an interconnect through a silicon substrate; depositing a re-distribution layer on the through silicon via die and connected to the interconnects; mounting a structure over the through silicon via die; connecting the structure to the interconnect of the through silicon via die with a direct interconnect; and encapsulating the through silicon via die and partially encapsulating the structure with an encapsulation.

20 Claims, 3 Drawing Sheets

INTEGRATED CIRCUIT PACKAGING SYSTEM HAVING THROUGH SILICON VIA WITH DIRECT INTERCONNECTS AND METHOD OF MANUFACTURE THEREOF

TECHNICAL FIELD

The present invention relates generally to an integrated circuit packaging system, and more particularly to a system for utilizing a through silicon via with direct interconnects in an integrated circuit packaging system.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system that includes: providing a through silicon via die having an interconnect through a silicon substrate; depositing a re-distribution layer on the through silicon via die and connected to the interconnects; mounting a structure over the through silicon via die; connecting the structure to the interconnect of the through silicon via die with a direct interconnect; and encapsulating the through silicon via die and partially encapsulating the structure with an encapsulation.

The present invention provides an integrated circuit packaging system including: a through silicon via die having an interconnect through a silicon substrate; a re-distribution layer deposited on the through silicon via die and connected to the interconnects; a structure mounted over the through silicon via die; a direct interconnect that connects the structure to the interconnect of the through silicon via die; and an encapsulation that encapsulates the through silicon via die and partially encapsulating the structure.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
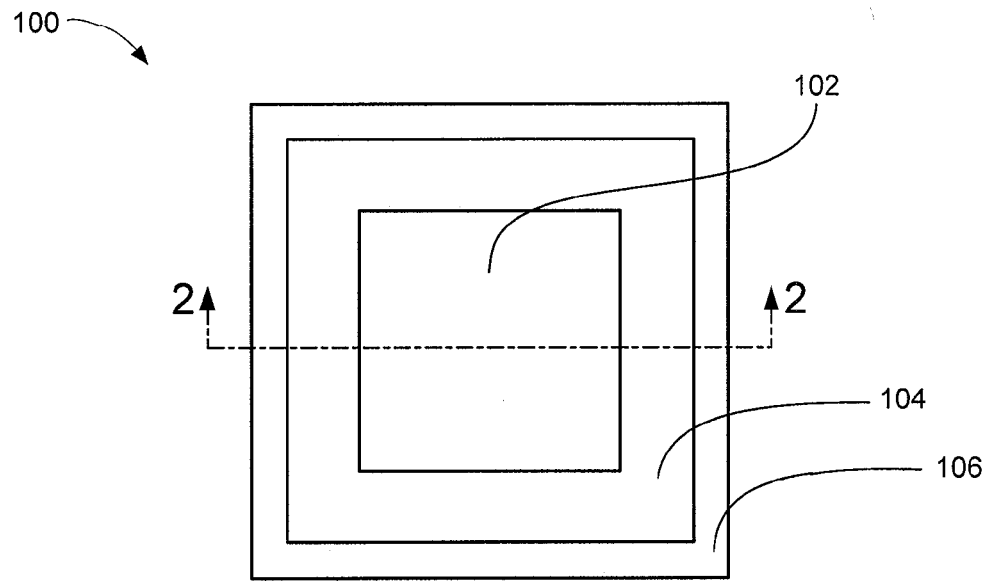
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 is shown having an external package 102 mounted above a structure such as an inner stacking module interposer 104. Partially encapsulating the inner stacking module interposer 104 is an encapsulation 106 such as a film assisted molding.

Figure 2:
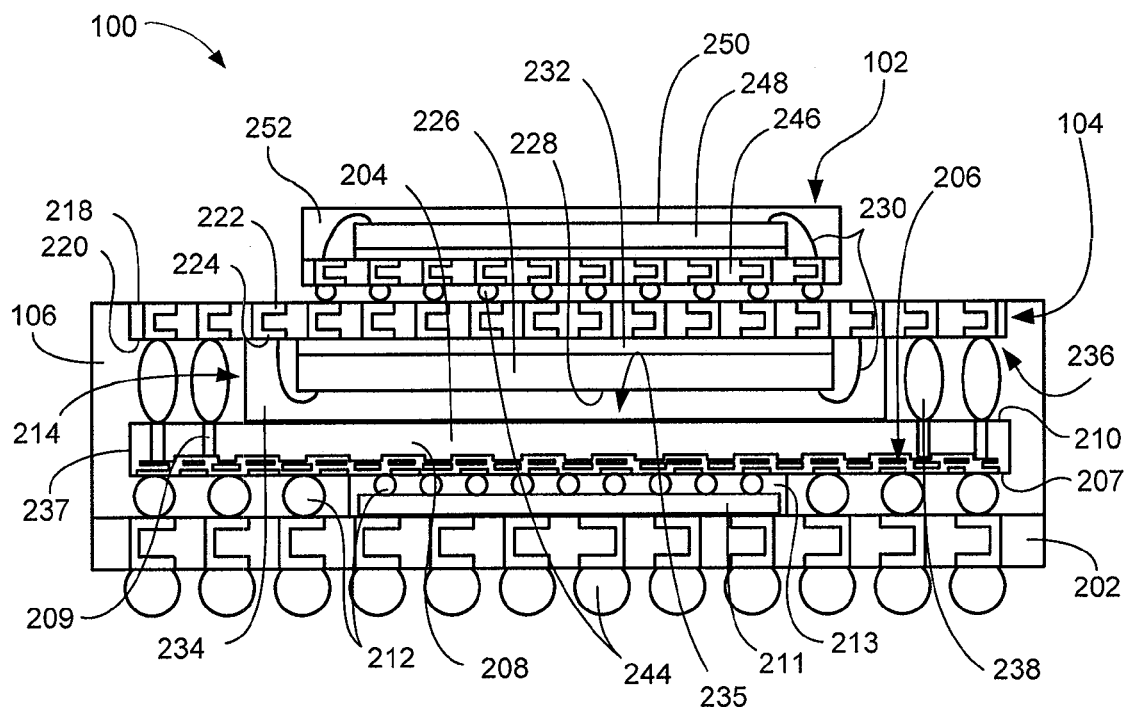
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a substrate 202 such as a laminated plastic or ceramic substrate.

Mounted above the substrate 202 is a through silicon via die 204 with a re-distribution layer 206 on a bottom side 207 of the through silicon via die 204. The through silicon via die 204 can create a very robust interconnection, greatly reduce the overall package size, and adds to the overall rigidity of the package.

The through silicon via die 204 uses a silicon substrate 208 with interconnects 209 formed through vias across the substrate 208. The interconnects 209 are very short lengths, typically less than 1 μm. With these shorter lengths, high frequency transmissions creates less parasitic inductance allowing higher frequency data transmission to be used. Further, utilizing higher frequency transmissions increases the range of transmission bandwidth. The short lengths also efficiently utilize the re-distribution layer 206 with less heating and lower power consumption.

It has been discovered that the application of the re-distribution layer 206 to the bottom side 207 of the through silicon via die 204 further decreases package size by combining elements while creating a very robust re-distribution layer 206 by adding the rigidity of the through silicon via die 204 to the re-distribution layer 206.

The re-distribution layer 206 may also be deposited on a top side 210 of the through silicon via die 204. Mounted between the through silicon via die 204 and the substrate 202 is an internal integrated circuit die such as a flip-chip 211. The flip-chip is connected to the re-distribution layer 206 with internal interconnects such as solder ball interconnects 212. Filling between the flip-chip 211 and the bottom side 207 of the through silicon via die 204 is an under-fill 213. Around the flip-chip 211, the bottom side 207 of the through silicon via die 204 is connected to the substrate 202 with the solder ball interconnects 212.

Mounted above the through silicon via die 204 is an inner stacking module 214. The inner stacking module 214 has the inner stacking module interposer 104. The inner stacking module interposer 104 is shown having two functional sides, such as a first functional side 218 and a second functional side 220, which allow for electrical signals to be routed between exposed conductors, such as exposed conductors 222, exposed from the first functional side 218, and exposed conductors 224, exposed from the second functional side 220.

The inner stacking module interposer 104 is typically a UV stabilized woven glass and epoxy resin with etched copper conductive pathways. Mounted below the inner stacking module interposer 104 is an integrated circuit die such as an inner stacking module die 226 such as a wire-bonded die with an active side 228. The active side 228 of the inner stacking module die 226 is connected to the inner stacking module interposer 104 with internal interconnects such as bond wires 230.

The inner stacking module die 226 is attached to the inner stacking module interposer 104 with a die attach adhesive 232. The inner stacking module die 226 and the bond wires 230 are encapsulated with an inner stacking module encapsulation 234. The inner stacking module die 226 is also mounted over a center portion 235 of the through silicon via die 204 and the inner stacking module die 226 does not extend horizontally past edges 237 of the through silicon via die 204.

The exposed conductors 224 on the second functional side 220 of the inner stacking module interposer 104 beneath an over-hang 236, are connected to the top side 210 of the through silicon via die 204 with direct interconnects 238 such as solder balls. The direct interconnects 238 are placed horizontally peripheral to the inner stacking module die 226 but do not extend horizontally past the edges 237 of the through silicon via die 204.

It has been discovered that the use of the direct interconnects 238 allows the use of larger inner stacking module interposers compared to the total package width because the encapsulation doesn't have to encapsulate other forms of interconnects such as wire bonds around the interposer, which also reduces total package height. Thus the direct interconnects 238 connecting the inner stacking module interposer 104 has shown to provide higher density input/output counts on the same size devices.

The encapsulation 106 encapsulates the through silicon via die 204 the solder ball interconnects 212, the inner stacking module 214, and partially encapsulates the inner stacking module interposer 104. The first functional side 218 of the inner stacking module interposer 104 is exposed from the encapsulation 106. The encapsulation 106, such as film assisted molding, protects sensitive components from moisture, dust and other contamination.

The encapsulation 106 has a top surface 243 that is level with the first functional side 218 of the inner stacking module interposer 104 exposed from the encapsulation 106. Mounted above the inner stacking module interposer 104 is the external package 102. The external package 102 is connected to the first functional side 218 with external interconnects such as solder balls 244.

The external package 102 has an external package substrate 246. Mounted above the external package substrate 246 is an external package integrated circuit 248 with an active side 250. The active side 250 of the external package integrated circuit 248 is connected to the substrate with the bond wires 230.

The external package 102 has an external package encapsulation 252 encapsulating the external package integrated circuit 248. Mounted below the substrate 202 are the solder balls 244.

Figure 3:
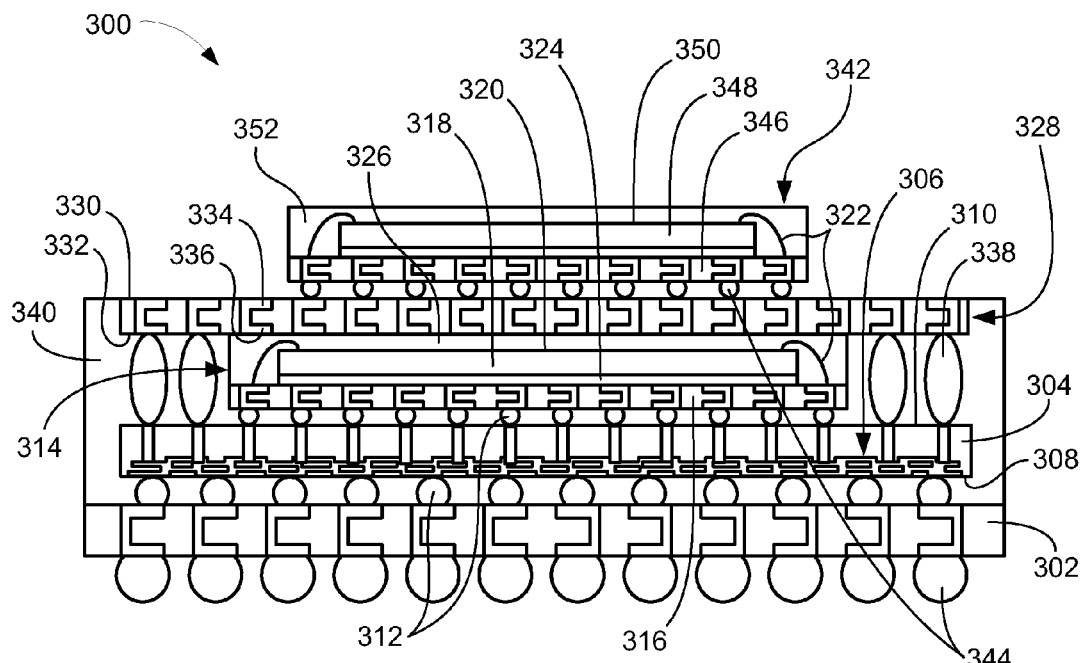
FIG. 3 is a cross-sectional view of an integrated circuit packaging system in a further embodiment of the present invention.

Referring now to FIG. 3, therein is shown a cross-sectional view of an integrated circuit packaging system 300 in a further embodiment of the present invention. The integrated circuit packaging system 300 is shown having a substrate 302 such as a laminated plastic or ceramic substrate.

Mounted above the substrate 302 is a through silicon via die 304 with a re-distribution layer 306 on a bottom side 308 of the through silicon via die 304. The through silicon via die 304 can create a very robust interconnection, greatly reduce the overall package size, and adds to the overall rigidity of the package.

It has been discovered that the application of the re-distribution layer 306 to the bottom side 308 of the through silicon via die 304 further decreases package size by combining elements while creating a very robust re-distribution layer 306 by adding the rigidity of the through silicon via die 304 to the re-distribution layer 306.

The re-distribution layer 306 may also be deposited on a top side 310 of the through silicon via die 304. The bottom side 308 of the through silicon via die 304 is connected to the substrate 302 with internal interconnects such as solder ball interconnects 312.

Mounted above the through silicon via die 304 is an inner stacking module 314. The inner stacking module 314 is connected to the top side 310 of the through silicon via die 304 with the solder ball interconnects 312.

The inner stacking module 314 has an inner stacking module substrate 316. Mounted above the inner stacking module substrate 316 is an integrated circuit die such as an inner stacking module die 318 such as a wire-bonded die with an active side 320. The active side 320 of the inner stacking module die 318 is connected to the inner stacking module substrate 316 with internal interconnects such as bond wires 322.

The inner stacking module die 318 is attached to the inner stacking module substrate 316 with a die attach adhesive 324. The inner stacking module die 318 and the bond wires 322 are encapsulated with an inner stacking module encapsulation 326.

Mounted above the inner stacking module 314 is a structure such as an interposer 328. The interposer 328 is shown having two functional sides, such as a first functional side 330 and a second functional side 332, which allow for electrical signals to be routed between exposed conductors, such as exposed conductors 334, exposed from the first functional side 330, and exposed conductors 336, exposed from the second functional side 332. The interposer 328 is typically a UV stabilized woven glass and epoxy resin with etched copper conductive pathways.

The exposed conductors 336 on the second functional side 332 of the interposer 328 are connected to the top side 310 of the through silicon via die 304 with direct interconnects 338 such as solder balls.

An encapsulation 340 encapsulates the through silicon via die 304 the solder ball interconnects 312, the inner stacking module 314, and partially encapsulates the interposer 328. The first functional side 330 is exposed from the encapsulation 340. The encapsulation 340, such as film assisted molding, protects sensitive components from moisture, dust and other contamination.

Mounted above the interposer 328 is an external package 342. The external package 342 is connected to the first functional side 330 with external interconnects such as solder balls 344. The external package 342 has an external package substrate 346. Mounted above the external package substrate 346 is an external package integrated circuit 348 with an active side 350. The active side 350 of the external package integrated circuit 348 is connected to the substrate with the bond wires 322.

The external package 342 has an external package encapsulation 352 encapsulating the external package integrated circuit 348. Mounted below the substrate 302 are the solder balls 344.

Figure 4:
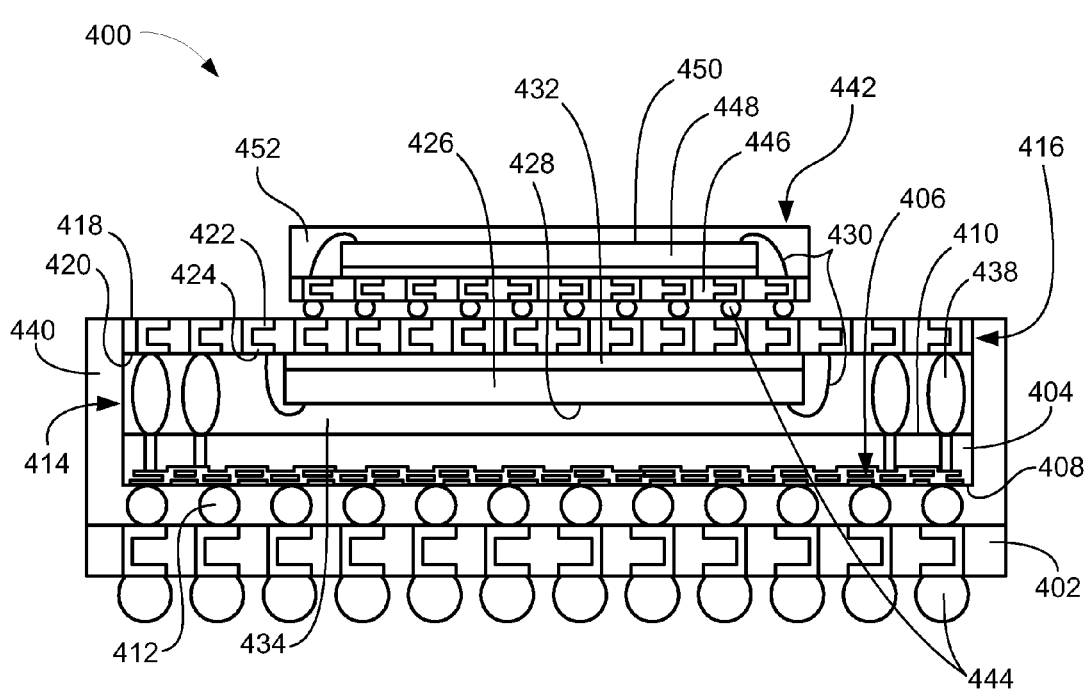
FIG. 4 is a cross-sectional view of an integrated circuit packaging system in a further embodiment of the present invention.

Referring now to FIG. 4, therein is shown a cross-sectional view of an integrated circuit packaging system 400 in a further embodiment of the present invention. The integrated circuit packaging system 400 is shown having a substrate 402 such as a laminated plastic or ceramic substrate.

Mounted above the substrate 402 is a through silicon via die 404 with a re-distribution layer 406 on a bottom side 408 of the through silicon via die 404. The through silicon via die 404 can create a very robust interconnection, greatly reduce the overall package size, and adds to the overall rigidity of the package.

It has been discovered that the application of the re-distribution layer 406 to the bottom side 408 of the through silicon via die 404 further decreases package size by combining elements while creating a very robust re-distribution layer 406 by adding the rigidity of the through silicon via die 404 to the re-distribution layer 406.

The re-distribution layer 406 may also be deposited on a top side 410 of the through silicon via die 404. The bottom side 408 of the through silicon via die 404 is connected to the substrate 402 with internal interconnects such as solder ball interconnects 412.

Mounted above the through silicon via die 404 is an inner stacking module 414. The inner stacking module 414 has a structure such as an inner stacking module interposer 416. The inner stacking module interposer 416 is shown having two functional sides, such as a first functional side 418 and a second functional side 420, which allow for electrical signals to be routed between exposed conductors, such as exposed conductors 422, exposed from the first functional side 418, and exposed conductors 424, exposed from the second functional side 420.

The inner stacking module interposer 416 is typically a UV stabilized woven glass and epoxy resin with etched copper conductive pathways. Mounted below the inner stacking module interposer 416 is an integrated circuit die such as an inner stacking module die 426 such as a wire-bonded die with an active side 428. The active side 428 of the inner stacking module die 426 is connected to the inner stacking module interposer 416 with internal interconnects such as bond wires 430.

The inner stacking module die 426 is attached to the inner stacking module interposer 416 with a die attach adhesive 432. The inner stacking module die 426 and the bond wires 430 are encapsulated with an inner stacking module encapsulation 434.

The exposed conductors 424 on the second functional side 420 of the inner stacking module interposer 416 are connected to the top side 410 of the through silicon via die 404 with direct interconnects 438 such as embedded solder balls.

The direct interconnects 438 are embedded in the inner stacking module encapsulation 434.

An encapsulation 440 encapsulates the through silicon via die 404 the solder ball interconnects 412, the inner stacking module 414, and partially encapsulates the inner stacking module interposer 416. The first functional side 418 of the inner stacking module interposer 416 is exposed from the encapsulation 440. The encapsulation 440, such as film assisted molding, protects sensitive components from moisture, dust and other contamination.

Mounted above the inner stacking module interposer 416 is an external package 442. The external package 442 is connected to the first functional side 418 with external interconnects such as solder balls 444. The external package 442 has an external package substrate 446. Mounted above the external package substrate 446 is an external package integrated circuit 448 with an active side 450. The active side 450 of the external package integrated circuit 448 is connected to the substrate with the bond wires 430.

The external package 442 has an external package encapsulation 452 encapsulating the external package integrated circuit 448. Mounted below the substrate 402 are the solder balls 444.

Figure 5:
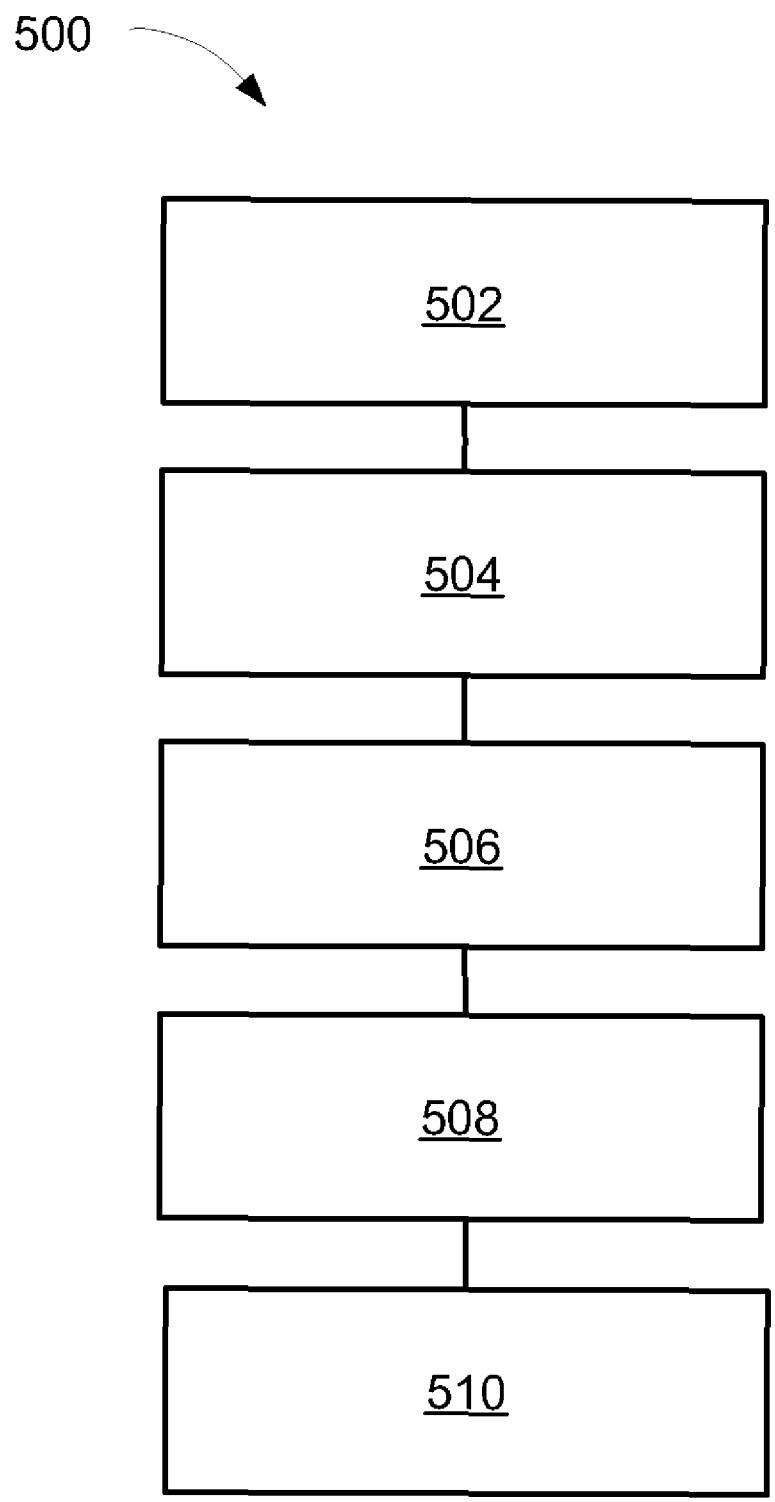
FIG. 5 is a flow chart of a method of manufacture of an integrated circuit packaging system of FIG. 1 in a further embodiment of the present invention.

Referring now to FIG. 5, therein is shown a flow chart of a method 500 of manufacture of an integrated circuit packaging system 100 of FIG. 1 in a further embodiment of the present invention. The method 500 includes providing a through silicon via die having an interconnect through a silicon substrate in a block 502; depositing a re-distribution layer on the through silicon via die and connected to the interconnects in a block 504; mounting a structure over the through silicon via die in a block 506; connecting the structure to the interconnect of the through silicon via die with a direct interconnect in a block 508; and encapsulating the through silicon via die and partially encapsulating the structure with an encapsulation in a block 510.

It has been discovered that the present invention thus has numerous aspects.

A principle aspect that has been unexpectedly discovered is that the present invention provide higher density input/output counts on the same size devices by allowing the use of larger inner stacking module interposers compared to the total package width because the encapsulation doesn't have to encapsulate other forms of interconnects such as wire bonds around the interposer, which also reduces total package height.

Another aspect is the through silicon via die increases overall package rigidity.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the through silicon via with direct interconnect system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a through silicon via die having an interconnect through a silicon substrate;
   depositing a re-distribution layer on the through silicon via die and connected to the interconnects;
   mounting an integrated circuit die over a center portion of the through silicon via die and the integrated circuit die does not extend horizontally past edges of the through silicon via die;
   mounting a structure over the through silicon via die;
   connecting the structure to the interconnect of the through silicon via die with a direct interconnect horizontally peripheral to the integrated circuit die and without extending horizontally past the edges of the through silicon via die; and
   encapsulating the through silicon via die and partially encapsulating the structure with an encapsulation.

2. The method as claimed in claim 1 further comprising: encapsulating the direct interconnect with the encapsulation.

3. The method as claimed in claim 1 further comprising: connecting an integrated circuit die below the through silicon via die.

4. The method as claimed in claim 1 further comprising:
   mounting an inner stacking module between the structure and the through silicon via die.

5. The method as claimed in claim 1 further comprising:
   encapsulating the direct interconnect with an inner stacking module encapsulation.

6. A method of manufacture of an integrated circuit packaging system comprising:
   providing a through silicon via die having an interconnect through a silicon substrate;
   depositing a re-distribution layer on the through silicon via die and connected to the interconnects;
   mounting a structure over the through silicon via die;
   mounting an integrated circuit die between the structure and the through silicon via die and over a center portion of the through silicon via die and the integrated circuit die does not extend horizontally past edges of the through silicon via die;
   connecting the structure to the interconnect of the through silicon via die with a direct interconnect horizontally peripheral to the integrated circuit die and without extending horizontally past the edges of the through silicon via die;
   encapsulating the through silicon via die and partially encapsulating the structure with an encapsulation; and
   connecting the integrated circuit die to the through silicon via die or the structure with an internal interconnect.

7. The method as claimed in claim 6 wherein:
   mounting the structure includes mounting a structure having an over-hang; and
   connecting the through silicon via die includes connecting the through silicon via die to the structure below the over-hang.

8. The method as claimed in claim 6 further comprising:
   forming a top surface on the encapsulation level with structure.

9. The method as claimed in claim 6 wherein:

mounting the structure includes mounting an inner stacking module interposer or an interposer.

10. The method as claimed in claim 6 further comprising:

mounting an external package above the structure; and connecting the external package to the structure with an external interconnect.

11. An integrated circuit packaging system comprising:

a through silicon via die having an interconnect through a silicon substrate;

a re-distribution layer deposited on the through silicon via die and connected to the interconnects;

an integrated circuit die mounted over a center portion of the through silicon via die and the integrated circuit die does not extend horizontally past edges of the through silicon via die;

a structure mounted over the through silicon via die;

a direct interconnect horizontally peripheral to the integrated circuit die mounted over the center portion of the through silicon via die and that connects the structure to the interconnect of the through silicon via die without extending horizontally past the edges of the through silicon via die; and an encapsulation that encapsulates the through silicon via die and partially encapsulating the structure.

12. The system as claimed in claim 11 wherein:

the direct interconnect is encapsulated by the encapsulation.

13. The system as claimed in claim 11 further comprising:

an integrated circuit die connected below the through silicon via die.

14. The system as claimed in claim 11 further comprising:

an inner stacking module mounted between the structure and the through silicon via die.

15. The system as claimed in claim 11 further comprising:

an inner stacking module encapsulation that encapsulates the direct interconnect.

16. The system as claimed in claim 11 wherein:

the integrated circuit die is mounted between the structure and the through silicon via die; and further comprising:

an internal interconnect that connects the integrated circuit die to the through silicon via die or the structure.

17. The system as claimed in claim 16 wherein:

the structure includes an over-hang; and the through silicon via die is connected to the structure below the over-hang.

18. The system as claimed in claim 16 further comprising:

a top surface on the encapsulation level with structure.

19. The system as claimed in claim 16 wherein:

the structure is an inner stacking module interposer or an interposer.

20. The system as claimed in claim 16 further comprising:

an external package mounted above the structure; and wherein:

the external package is connected to the structure with an external interconnect.

* * * * *

UNITED STATES PATENT AND TRADEMARK OFFICE
CERTIFICATE OF CORRECTION

PATENT NO. : 7,859,099 B2  
APPLICATION NO. : 12/333297  
DATED : December 28, 2010  
INVENTOR(S) : Choi et al.

Page 1 of 1

It is certified that error appears in the above-identified patent and that said Letters Patent is hereby corrected as shown below:

<u>Column 9</u>:

claim 11, line 22, delete "that connects" and insert therefor --connecting-- claim 11, line 26, delete "that encapsulates" and insert therefor --encapsulating--

<u>Column 10</u>:

claim 15, line 8, delete "that encapsulates" and insert therefor --encapsulating-- claim 16, line 14, delete "that connects" and insert therefor --connecting--

Signed and Sealed this  
Twenty-first Day of June, 2011

David J. Kappos  
*Director of the United States Patent and Trademark Office*